(12) United States Patent
Higuchi et al.

(10) Patent No.: US 9,042,069 B2
(45) Date of Patent: May 26, 2015

(54) POWER SUPPLY CONTROLLER

(75) Inventors: Yutaka Higuchi, Yokkaichi (JP); Seiji Takahashi, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 13/498,040

(22) PCT Filed: Sep. 24, 2010

(86) PCT No.: PCT/JP2010/066524
§ 371 (c)(1),
(2), (4) Date: Mar. 23, 2012

(87) PCT Pub. No.: WO2011/037175
PCT Pub. Date: Mar. 31, 2011

(65) Prior Publication Data
US 2012/0176115 A1 Jul. 12, 2012

(30) Foreign Application Priority Data
Sep. 25, 2009 (JP) .................................. 2009-221416

(51) Int. Cl.
*H02H 5/04* (2006.01)
*H02H 3/087* (2006.01)
(Continued)

(52) U.S. Cl.
CPC ............... *H02H 3/087* (2013.01); *H02H 6/005* (2013.01); *H02H 7/226* (2013.01); *H03K 17/08* (2013.01); *H02M 1/32* (2013.01); *H02M 2001/327* (2013.01)

(58) Field of Classification Search
USPC .................................. 361/93.8, 103; 323/294
See application file for complete search history.

(56) References Cited

U.S. PATENT DOCUMENTS 6,205,010 B1* 3/2001 Ohsaka et al. ................ 361/103
6,520,279 B2* 2/2003 Fukumoto et al. ............ 180/446
(Continued)

FOREIGN PATENT DOCUMENTS

DE          102 45 484 A1       4/2004
DE   11 2008 003 096 T5     10/2010
(Continued)

OTHER PUBLICATIONS

International Search Report mailed Dec. 21, 2010 issued in International Patent Application No. PCT/JP2010/066524 (with translation).

(Continued)

*Primary Examiner* — Adolf Berhane
*Assistant Examiner* — Henry Lee, III
(74) *Attorney, Agent, or Firm* — Oliff PLC (57) ABSTRACT

The power supply controller performs the power-supply-path protection operation to restrict power supply through the switch element if a value of temperature increase of the power supply path W with respect to the reference temperature To exceeds the temperature threshold value and remove the restriction if the temperature decreases to the temperature threshold value or lower. And the controller performs the switch protection operation to restrict the power supply through the switch element if the value of the flowing current exceeds the current threshold value and remove the restriction after the reference time H elapses. And also the controller adds the additional value F to the value of temperature increase on condition that the value of the flowing current exceeds the current threshold value in the power supply protection operation and compares a post-addition temperature to the temperature threshold value.

4 Claims, 6 Drawing Sheets (51) Int. Cl.
  *H03K 17/08* (2006.01)
  *H02M 1/32* (2007.01)
  *H02H 3/00* (2006.01)
  *H02H 6/00* (2006.01)
  *H02H 7/22* (2006.01)

(56) References Cited

U.S. PATENT DOCUMENTS

| | | | |
|---|---|---|---|
| 7,339,773 | B2 | 3/2008 | Gergintschew |
| 7,848,071 | B2 | 12/2010 | Takahashi et al. |
| 8,405,946 | B2 | 3/2013 | Higuchi et al. |
| 8,767,367 | B2 | 7/2014 | Higuchi et al. |
| 8,918,222 | B2 * | 12/2014 | Higuchi et al. ............... 700/293 |
| 2004/0090910 | A1 | 5/2004 | Dzieduszko |
| 2005/0073786 | A1 * | 4/2005 | Turnbull et al. ............. 361/93.1 |
| 2007/0146951 | A1 | 6/2007 | Takahashi et al. |
| 2007/0253132 | A1 * | 11/2007 | Nakamura et al. ........... 361/103 |
| 2008/0285197 | A1 * | 11/2008 | Nakamura ................... 361/93.8 |
| 2010/0254059 | A1 * | 10/2010 | Higuchi et al. ............... 361/103 |
| 2011/0019325 | A1 * | 1/2011 | Nakamura ................... 361/93.8 |
| 2011/0043958 | A1 * | 2/2011 | Nakamura et al. ........... 361/93.8 |
| 2011/0080681 | A1 * | 4/2011 | Maruyama et al. .......... 361/93.8 |
| 2013/0163138 | A1 | 6/2013 | Higuchi et al. |

FOREIGN PATENT DOCUMENTS

| | | |
|---|---|---|
| JP | A-2007-174490 | 7/2007 |
| JP | A-2008-289297 | 11/2008 |
| JP | A-2010-158108 | 7/2010 |

OTHER PUBLICATIONS

Written Opinion of the International Searching Authority mailed Dec. 21, 2010 issued in International Patent Application No. PCT/JP2010/066524 (with translation).

Office Action dated Dec. 2, 2013 issued in Chinese Patent Application No. 201080042534.0 (with English translation).

Office Action dated Jul. 16, 2014 issues in Chinese Patent Application No. 201080042534.0 (with English translation).

Jan. 9, 2015 Office Action issued in German Patent Application No. 112010003778.7.

* cited by examiner

POWER SUPPLY CONTROLLER

TECHNICAL FIELD

The present invention relates to a power supply controller having a function to protect a switch element and a power supply path.

BACKGROUND ART

A power supply controller includes a switch element for permitting/inhibiting power supply from a power source to a load in order to control power supply to the load by turning the switch element on and off. In such a power supply controller, if an overcurrent flows, the switch element may burn out or a wire (power supply path) may smoke in some cases. Accordingly, a configuration is necessary in which if the overcurrent flows, the switch element would be held in the off-state to inhibit currents from flowing to the load, thereby protecting the switch element and the wire.

Generally, a semiconductor switch and a wire are different from each other in terms of thermal characteristics (heat generation characteristics and heat dissipation characteristics), hence power supply inhibition conditions may be different from each other. Typically, the switch element has smaller turn-on resistance and thermal capacity as compared to those of the wire. Therefore, it is necessary to immediately prohibit power supply if the value of an overcurrent is relatively large in order to protect the switch element but not necessary to do so if the value is relatively small. However, the wire has a large thermal capacity as compared to the switch element. Therefore, in order to protect the wire it is necessary to inhibit the power supply when an overcurrent flows for a long period of time even if its value is relatively small since there is a possibility of smoking. Accordingly, such differences in the power supply inhibition conditions lead to a necessity of different configurations to protect the switch element and to protect the wire respectively.

Regarding this point, conventionally a power supply controller which has a switch element protection circuit (Patent Document 1) is available. The switch element protection circuit performs a retry operation to turnoff the switch element if an overcurrent is detected and remove it from the off-state after a predetermined time (shut-off time) elapses and, if the number of times of the retry operation reaches a predetermined value, inhibits the power supply operation (retry operation). Further, the switch element protection circuit is configured to reset the number of times of performing the retry operation to zero if a state where no overcurrent is detected continues for a predetermined time (clear time) before the number of times of performing the retry operation reaches the predetermined value.

Patent Document 1: Japanese Unexamined Patent Publication No. 2007-174490

DISCLOSURE OF THE PRESENT INVENTION

Problem to be Solved by the Invention

However, the power supply controller including such a switch element protection circuit requires counters for counting the number of times of performing the retry operations and the clear time, respectively, as well as the shut-off time. This impeded reduction in size and weight of the circuit, for example.

In view of the above, the present invention has been developed, and it is an object of the present invention to provide a power supply controller configured to reduce the number of the counters used for protection of the switch element.

Means for Solving the Problem

To solve the problem, a power supply controller according to a first invention includes: a switch element connected to a power supply path between a power source and a load; a current detection element configured to output a detection signal corresponding to a value of a flowing current flowing through the power supply path; a power-supply-path protection unit configured to perform a power-supply-path protection operation which restricts power supply by use of the switch element on condition that a value of temperature increase of the power supply path with respect to a reference temperature exceeds a temperature threshold value; and a switch protection unit configured to perform a switch protection operation which restricts the power supply by use of the switch element on condition that a value of the flowing current based on the detection signal exceeds a current threshold value and removes the restriction after a reference time, wherein the power-supply-path protection unit adds an additional value to the value of temperature increase on condition that the value of the flowing current exceeds the current threshold value and compares a post-addition temperature to the temperature threshold value.

According to the invention, a power-supply-path protection operation is performed which restricts the power supply by use of the switch element on condition that the value of temperature increase of the power supply path with respect to a reference temperature exceeds the temperature threshold value. At the same time, a switch protection operation is performed which restricts current flow by use of the switch element on condition where the value of the flowing current has exceeded the current threshold value. Further, an additional value is added to the value of temperature increase of the power supply path on condition where the value of the flowing current exceeds the current threshold value and the power-supply-path protection operation is performed on condition where a post-addition temperature exceeds the temperature threshold value.

Accordingly, the number of times of performing the switch protection operation (retry operation) is limited to a value in accordance with a difference between the reference temperature and the temperature threshold value and the additional value. This limitation is realized by utilizing a configuration of the power-supply-path protection unit, so that it is unnecessary to provide a dedicated counter for counting the number of times.

Further, if the additional value is added to the value of the temperature increase of the power supply path due to malfunction of the switch protection operation caused by noise etc., to the value of the temperature increase of the power supply path returns to the value before the addition of the additional value after a predetermined time. Therefore, in contrast to the conventional techniques, it is unnecessary to provide a counter for clearing the number of times of performing retries.

A second invention provides the power supply controller according to the first invention, in which the power-supply-path protection unit calculates the value of temperature increase based on the value of the flowing current and thermal characteristics of the power supply path.

According to this invention, it is possible to obtain the value of temperature of the power supply path without using a temperature sensor.

A third invention is the power supply controller according to the first or second invention, in which the additional value is a fixed value.

According to this invention, it is possible to change the number of times of performing the switch protection operation (number of times of retry) in accordance with a difference between the reference temperature and the temperature threshold value.

The fourth invention is the power supply controller according to the first or the second invention, in which the power-supply-path protection unit changes the additional value in accordance with a value obtained by dividing the difference between the reference temperature and the temperature threshold value by a defined value.

According to this invention, it is possible to make the number of times of performing the switch protection operation (number of times of retry) constant regardless of whether the reference temperature is high or low.

Advantageous of the Invention

The present invention enables reducing the number of the counters which are used to protect the switch element.

DESCRIPTION OF REFERENCE NUMERALS

10 Microcomputer (power-supply-path protection unit, switch protection unit)
35: Semiconductor switch element (switch element)
38: Sense MOSFET (current detection element)
100: Power supply controller
F: Additional value
H: Reference time
I: Flowing current
Imax: Current threshold value
L: Load
Tw: Wire temperature
ΔTw: Value of temperature increase
To: Reference temperature
Vsens: Sense voltage signal (detection signal)
Vdc: Power source
W: Wire (power supply path)

BEST MODE FOR CARRYING OUT THE INVENTION

A description will be given of one embodiment of the present invention with reference to FIGS. 1 to 5.
A power supply controller 100 in the present embodiment is mounted in a vehicle (not shown), to control supply of power from a power source for use in the vehicle (hereinafter referred to as "power source Vdc") to a load L. The load may come in, for example, a lamp in the vehicle, a cooling fan motor, or a defogging heater.

1. Overall Configuration of Power Supply Controller

Figure 1:
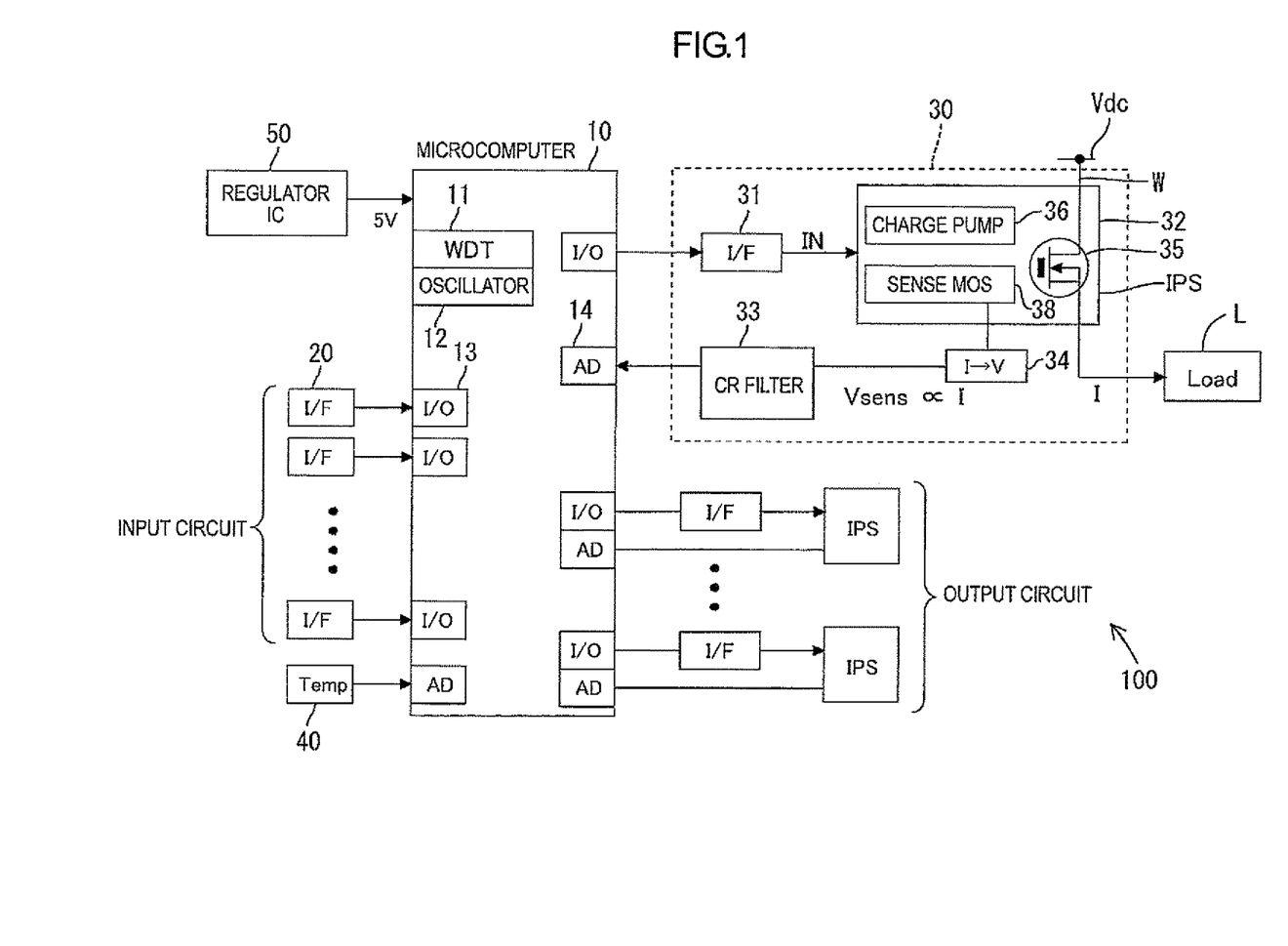
FIG. 1 is a block diagram of a power supply controller according to a first embodiment of the present invention.

FIG. 1 is a block diagram showing an outlined configuration of the power supply controller 100. The power supply controller 100 includes a semiconductor switch element 35 (for example, MOSFET; one example of "switch element") to control supply of power from the power source Vdc to the load L by turning on and off the semiconductor switch element 35. The semiconductor switch element 35 is connected to a wire W (for example, wire harness; one example of "power supply path") between the power source Vdc and the load L. Further, the power supply controller 100 has a switch protection function to protect the semiconductor switch element 35 itself and a wire protection function to protect the wire W.

Specifically, the power supply controller 100 includes a microcomputer 10, a plurality of (8 in the present embodiment) input circuits 20, a plurality of (8 in the present embodiment) output circuits 30, a reference temperature setting circuit 40, a regulator IC 50, and the like. The number of the input circuits 20 and that of the output circuits 30 are changed respective as necessary in accordance with the numbers of the loads to be power-controlled and the wires W to be protected, and the like.

The microcomputer 10 includes a watchdog terminal (WDT) 11, an oscillator terminal 12, a plurality of I/O terminals 13, a plurality of A/D conversion input terminals 14, and the like. The microcomputer 10 performs operations to calculate the temperature of the wire W and protect the switch and the wire in accordance with instructions of a program stored in a memory (not shown) in the microcomputer 10, for example. In this case, the microcomputer 10 functions as the "power-supply-path protection unit" and the "switch protection unit."

Each of the input circuits 20 has an input interface (I/F) circuit to thereby, for example, convert various types of input signals transmitted through input operations on an operation panel on a passenger seat etc., into signals which is compatible with the microcomputer 10 and transmits them to the microcomputer 10.

The output circuits 30 each include an output interface (I/F) circuit 31, an intelligent power switch (IPS) 32, an CR low-pass filter 33, a current/voltage conversion circuit (conversion circuit) 34 and the like.

The IPS 32 includes a semiconductor switch element 35 (for example, n-channel MOSFET), a charge pump 36, and a sense MOSFET 38 (one example of the "current detection element"). The semiconductor switch element 35 turns on/off a flowing current I which is passed from the power source Vdc to the load L and the charge pump 36 steps up a control voltage for the semiconductor switch element 35. The sense MOSFET 38 generates a sense current which has a predetermined ratio relationship with a load current I.

The sense current is converted by the current/voltage conversion circuit 34 into a sense voltage signal (conversion signal) Vsens (one example of the "detection signal") which has a proportional relationship with the sense current. The current/voltage conversion circuit is configured by, for example, a sense current detection resistor. The sense voltage signal Vsens is supplied to the CR low-pass filter 33. The CR low-pass filter 33 cancels a predetermined high-frequency component from the sense voltage signal Vsens and supplies the sense voltage signal Vsens free of the high-frequency component to the microcomputer 10 at its A/D conversion input terminal 14. The CR low-pass filter 33 preferably has a time constant sufficiently lower than a heat dissipation time constant of the harness. In the present embodiment, the time constant of the CR low-pass filter 33 is set to 0.1 ms.

The microcomputer 1 converts the sense voltage signal Vsens into a flowing current I. For example, an actual value of the flowing current I is obtained by using a map of correspondence between the sense voltage signal Vsens and the flowing current I. The correspondence map is stored in the memory (not shown) of the microcomputer 10, for example.

The reference temperature setting circuit 40 sets a reference temperature To (ambient temperature) which is used when the microcomputer 10 starts calculation of the temperature of the wire W. The reference temperature setting circuit 40 includes a temperature sensor (not shown) mounted in an engine room of the vehicle, for example, and an amplification circuit (not shown) which amplifies a sensor signal from this temperature sensor to generate a temperature signal that indicates the temperature of the engine room. The reference temperature setting circuit 40 supplies, as the reference temperature To, the temperature signal indicating the temperature of the engine room to the microcomputer 10 at its A/D conversion input terminal 14. The reference temperature setting circuit 40 includes a plurality of temperature sensors and a plurality of amplification circuits corresponding to the number of the ambient temperatures to be detected. Further, the reference temperature setting circuit 40 may include a comparison circuit or the like for selecting a reference temperature from the plurality of ambient temperatures detected.

The regulator IC 50 converts a predetermined DC voltage, for example, 12 V into a supply voltage of the microcomputer 10, for example, 5 V and provides the 5-volt DC voltage to the microcomputer 10.

2. Calculation of Wire Temperature

Figure 2:
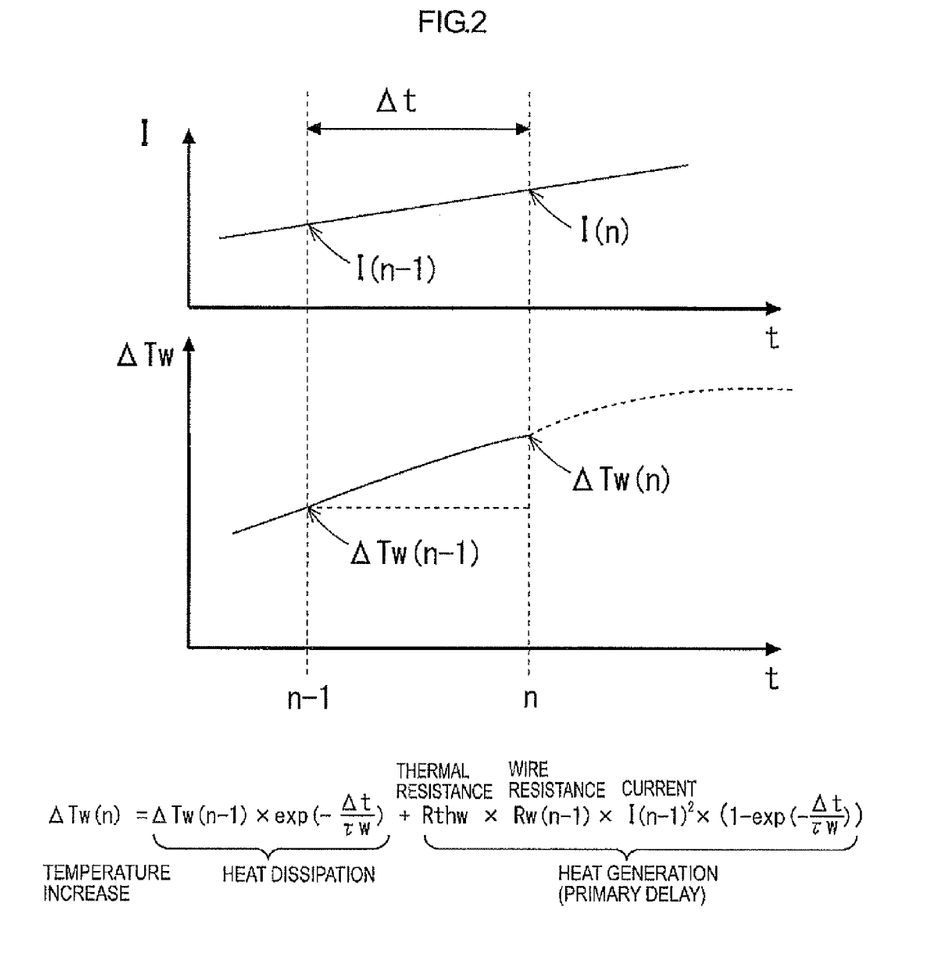
FIG. 2 is an explanatory graph of calculation of a wire temperature.

FIG. 2 is an explanatory graph of calculation (estimate) of the wire temperature. The microcomputer 10 detects a value of the flowing current I each time a predetermined sampling time interval $\Delta t$ and directly calculates a the value of temperature increase $\Delta Tw$ with respect to the reference temperature To of the wire W based on the detected value of the flowing current I and the thermal characteristics (heat dissipation characteristics and heat generation characteristics) of the wire W, in other words, a loss of the wire W (heat dissipation of the wire W) due to the flowing current I and a heat dissipation time constant $\tau w$ of the wire W. Then, the reference temperature To is added to the value of temperature increase $\Delta Tw$, to calculate the wire temperature Tw (=To+$\Delta Tw$).

More specifically, the microcomputer 10 calculates the value of temperature increase $\Delta Tw$ by substituting the detected value of the flowing current I into a relational expression of heat dissipation and heat generation of the wire W shown in FIG. 2 and the following equation 1. Then, the microcomputer 10 adds the calculated value of temperature increase $\Delta Tw$ of the wire W to the reference temperature To to calculate the current wire temperature Tw(n) (=To+$\Delta Tw(n)$).

$$\Delta Tw(n)=\Delta Tw(n-1)\times\exp(-\Delta t/\tau w)+Rthw\times Rw(n-1)\times I(n-1)^2\times(1-\exp(-\Delta t/\tau w)) \quad \text{(equation 1)}$$

where, I(n): value [A] of the flowing current I in the $n^{th}$ sampling (n: integer of 1 or larger);
$\Delta Tw(n)$: value of temperature increase [° C.] in the $n^{th}$ sampling;
Rw(n): wire resistance [Ω] in the $n^{th}$ sampling;
Rw(0): wire resistance [Ω] at a temperature (for example, reference temperature To);
Rthw: thermal resistance of wire W [° C./W];
$\tau w$: heat dissipation time constant of wire W [s];
$\kappa w$: resistor temperature coefficient of wire W [/° C.]; and
$\Delta t$: sampling time interval [s].

In equation 1, the first term in the right side excluding the flowing current I indicates a temperature component due to the heat dissipation of the wire W and the second term in the right side including the flowing current I indicates a temperature component due to the heat generation of the wire W. Therefore, in case the semiconductor switch element 35 is turned off and the power supply to the load L is shut off, the value of temperature increase $\Delta Tw$ is determined based on only the first term.

3. Wire Protection Function

Figure 3:
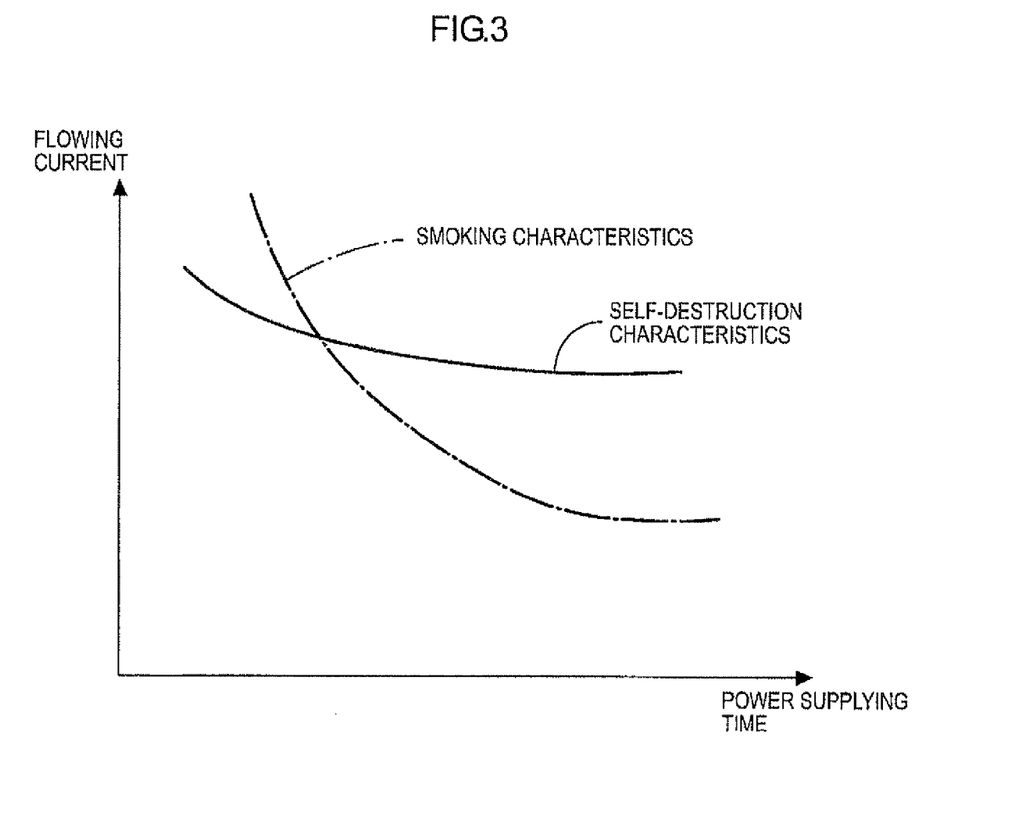
FIG. 3 is a graph showing smoking characteristics of a wire and self-destruction characteristics of a switch element.

FIG. 3 is a graph showing smoking characteristics of the wire W (relationship between a flowing current and a smoking temperature) and self-destruction characteristics of the semiconductor switch element 35 (relationship between the flowing current and a self-destruction temperature). The positions of the characteristics lines vary with a change in ambient temperature.

The wire W may encounter short-circuiting if, for example, its outer coat deteriorates to cause its core wire to come in contact with the body of the vehicle, in which case there is a possibility of an overcurrent to thereby burn the wire W. To solve the problem, the microcomputer 10 executes the wire protection function. The wire protection function compares the wire temperature Tw calculated for each sampling time interval $\Delta t$ with an upper limit temperature Tmax and forcibly turns off (hereinafter referred to as "first forced turn-off operation") the semiconductor switch element 35 irrespective of whether the input signal is applied to the input circuit 20 on condition that the wire temperature Tw has exceeded the upper limit temperature Tmax and removes the first forced turn-off operation on condition where the wire temperature Tw decreases to the upper limit temperature Tmax or lower. As a result, it is possible to prevent smoking of the wire W. The upper limit temperature Tmax is set to somewhat lower value than the smoking temperature (see FIG. 3) based on the smoking characteristics of the wire W.

In such a configuration, even if the wire temperature Tw increases irregularly due to such a short-circuit current that the semiconductor switch element 35 is turned on and off repeatedly, it is possible to securely grasp the value of temperature increase $\Delta Tw$ of the wire W, thereby shutting off the flowing current I before the wire W reaches the smoking temperature.

4. Switch Protection Function

As shown in FIG. 3, the smoking characteristics and the self-destruction characteristics differ from each other significantly. Specifically, the semiconductor switch element 35 has a small turn-on resistance and has a relatively small thermal capacity as compared to the wire W. Accordingly, in a case where an overcurrent occurs, even if the wire temperature Tw of the wire W is yet to reach the upper limit temperature Tmax, the power supply must be shut off immediately in order to protect the semiconductor switch element 35.

Therefore, the microcomputer 10 executes the switch protection function independently of the wire protection function. In the switch protection function, the microcomputer 10 performs a retry operation. In the retry operation, the microcomputer 10 compares a value of the flowing current I detected for each sampling time interval $\Delta t$ to a current threshold value Imax, and temporarily turns off (hereinafter referred to as "second forced turn-off operation") the semiconductor switch element 35 irrespective of whether the input signal is applied to the input circuit 20 on condition that the value of the flowing current I exceeds the current threshold value Imax, and removes the second forced turn-off operation after a reference time H elapses. And the microcomputer 10 adds an additional value F to the wire temperature. The current threshold value Imax is set to somewhat lower value than the self-destruction temperature (see FIG. 3) based on the self-destruction characteristics of the semiconductor switch element 35.

In a case where the wire temperature exceeds the upper limit threshold temperature value owing to repetition of the retry operation, the number of times of performing the retry operation can be limited in order to shut off the power supply. Further, even if the power supply is shut off because it is determined mistakenly due to noise etc. that the value of the flowing current I exceeds the current threshold value Imax, the value of temperature increase to which the additional value is added returns to its original value after the constant of time elapses, so that the limited number of times that the retry operation can be performed also returns to its original value (clear operation).

Further, if the retry operation is repeated a reference number of times, the semiconductor switch element 35 is put in the off-state continuously in order to prohibit even the subsequent retry operation. The continuous off-state is not removed even if the reference time H elapses, unlike the second forced turn-off operation. In such a configuration, it is possible to inhibit the semiconductor switch element 35 from being turned off forcedly because it is mistakenly determined due to, for example, noise etc. that the value of the flowing current exceeds the current threshold value Imax. The microcomputer 10 implements the switch protection function by utilizing the processing for the wire protection function.

5. Contents of Processing by Microcomputer

Figure 4:
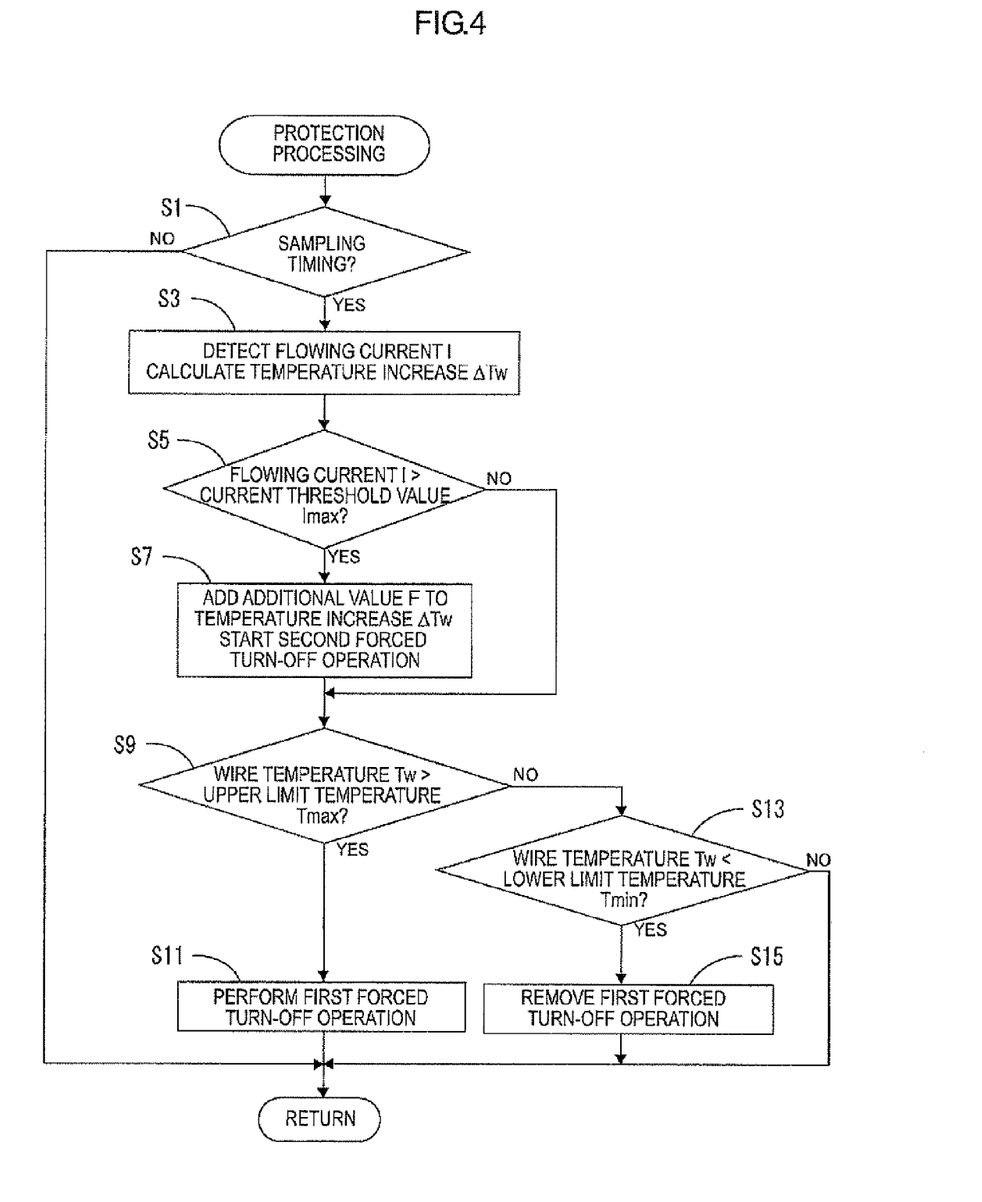
FIG. 4 is a flowchart showing protection processing.
Figure 5:
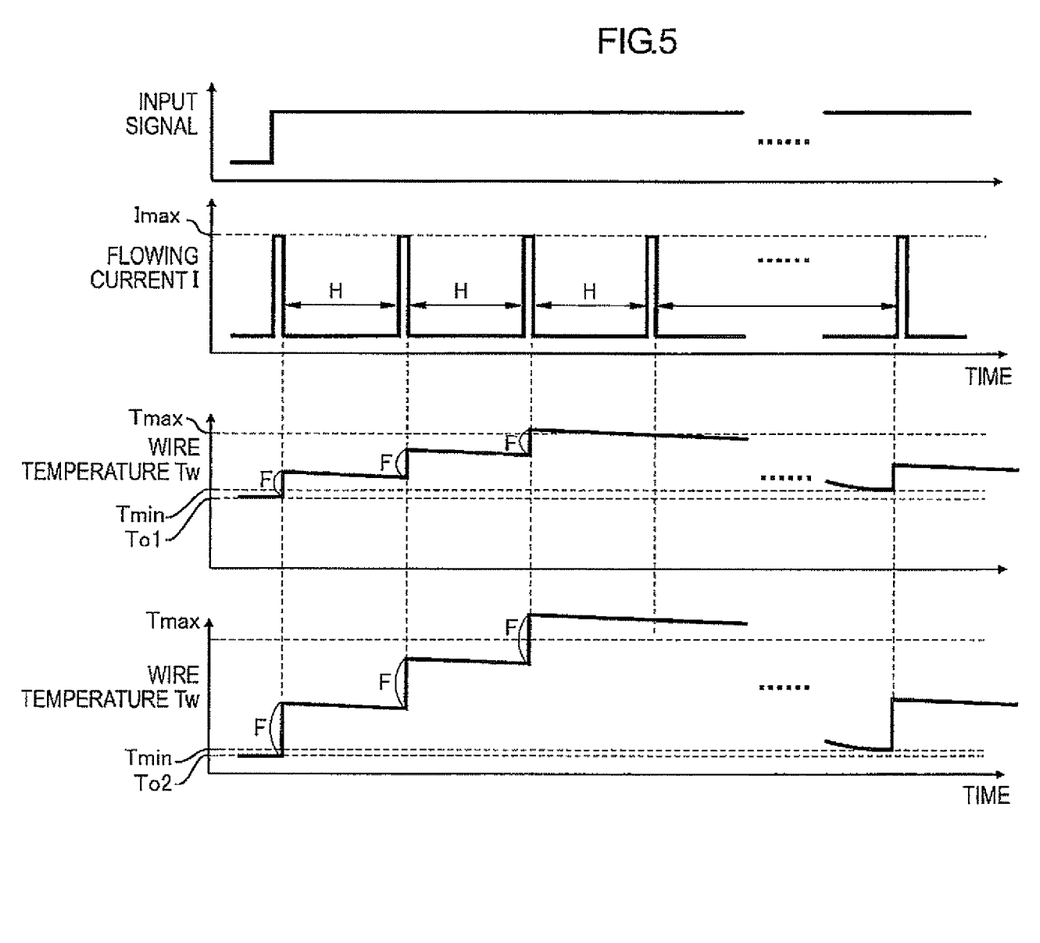
FIG. 5 is a timing chart (No. 1) showing changes in input signal, flowing current, and wire temperature.

FIG. 4 is a flowchart showing the protection processing. FIG. 5 is a timing chart showing changes in the input signal, the flowing current I, and the wire temperature Tw. Upon power application on the power supply controller 100, first the microcomputer 10 acquires the present reference temperature To from the temperature sensor and subsequently performs protection processing repeatedly.

The microcomputer 10 determines in S1 whether sampling timing has come or not and, if it has come (YES in S1), detects the present value of the flowing current I in S3 and calculates the value of temperature increase ΔTw from the value of the flowing current I.

The microcomputer 10 determines in S5 whether the value of the flowing current I exceeds the current threshold value Imax or not. If determined that the value of the flowing current I exceeds the current threshold value Imax (YES in S5), the microcomputer 10 adds the additional value F to the value of temperature increase ΔTw in S7, performs the second forced turn-off operation on the semiconductor switch element 35 and makes the shift to S9. After the second forced turn-off operation on the semiconductor switch element 35, while going on with processing in S9 and the subsequently, the microcomputer 10 concurrently performs processing to remove the second forced turn-off operation after the reference time elapses since this second forced turn-off operation. In the present embodiment, the additional value F is a temperature (=[Tmax−To]/X) obtained by dividing a difference between the upper limit temperature Tmax and the reference temperature To by the number of times X of performing the retry operation.

On the other hand, if determined that the value of the flowing current I is equal to or lower than the current threshold value Imax (NO in S5), the microcomputer 10 makes the shift to 59 without adding the additional value F to the value of temperature increase ΔTw.

In S9, the microcomputer 10 determines whether the wire temperature Tw is in excess of the upper limit temperature Tmax or not. The determination may be made on whether the value of temperature increase ΔTw is in excess of the temperature threshold value (=upper limit temperature Tmax−reference temperature To).

If the wire temperature Tw is in excess of the upper limit temperature Tmax (YES in S9), the first turn-off operation is performed on the semiconductor switch element 35 in S11 and then the process returns to S1. On the other hand, if the wire temperature Tw is not in excess of the upper limit temperature Tmax, the microcomputer 10 determines in S13 whether the wire temperature Tw is below a lower limit temperature Tmin or not. If the wire temperature Tw is below the lower limit temperature Tmin (YES in S13), the first forced off-state, if it is under way, is removed in S15 and then the process returns to S1. If the wire temperature Tw is not lower than the lower limit temperature Tmin (NO in S13), a return is made to S1 without changing the on-/off-state of the semiconductor switch element 35.

6. Operation and Effects of the Present Embodiment

FIG. 5 shows a case where the flowing current I exceeds the current threshold value Imax immediately after the input signal is applied to the input circuit 20. In this case, the semiconductor switch element 35 is put into the second forced off-state (see the second stage in the figure) to shut off the power supply (the flowing current I is reduced to zero approximately) so that the semiconductor switch element 35 can be protected and the wire temperature Tw somewhat decreases due to heat dissipation of the wire W.

Further, in the second forced off-state, the wire temperature Tw is calculated by adding the additional value F to the value of temperature increase ΔTw (see the third stage in the figure). Then, if the wire temperature Tw (=To+ΔTw+F) is not larger than the upper limit temperature Tmax, the second forced off-state is removed (the retry operation) after the reference time H elapses since the second forced turn-off operation is performed, so that the flowing current I restarts to flow. In a case where the flowing current I exceeds the current threshold value Imax even if this retry operation is performed, the second forced turn-off operation is applied to the semiconductor switch element 35 again. Then, if the wire temperature Tw exceeds the upper limit temperature Tmax, the first forced turn-off operation is performed on the semiconductor switch element 35 to thereby prohibit the retry operation.

In such a manner, in the configuration of the present embodiment, in the processing of calculating the wire temperature Tw, each time the second forced turn-off operation is performed, the additional value F is added to the value of temperature increase ΔTw to calculate the wire temperature Tw, so that if this wire temperature Tw exceeds the upper limit temperature Tmax, the retry operation is ended, thereby eliminating a necessity of a dedicated counter for counting the retry operations.

Moreover, the additional value F is a temperature (=[Tmax−To]/X) obtained by dividing a difference between the upper limit temperature Tmax and the reference temperature To by the number of times x of performing the retry operation. Therefore, as shown at the third and the fourth stages in FIG. 5, irrespective of whether the reference temperature To is higher or lower (To1>To2), the number of times of performing the retry operation can be set to [X] times approximately.

Figure 6:
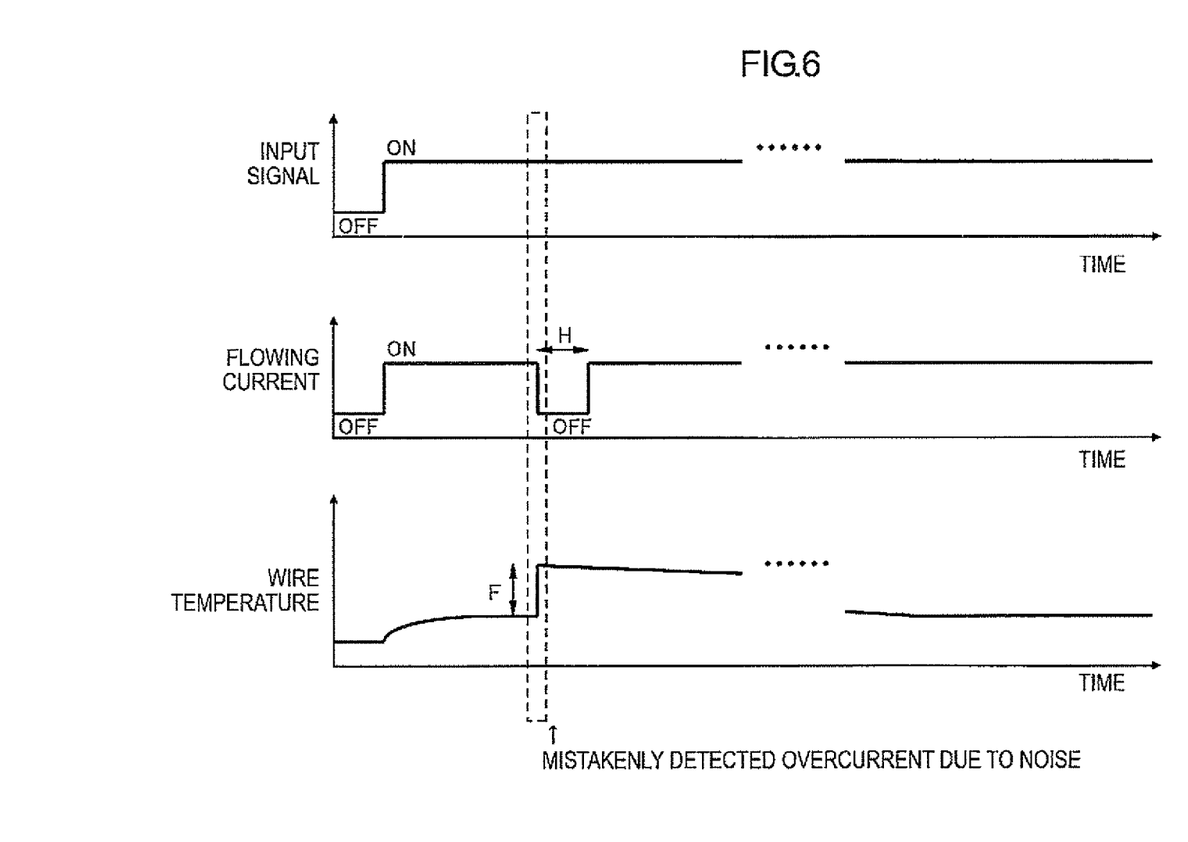
FIG. 6 is a timing chart (No. 2) showing changes in input signal, flowing current, and wire temperature.

Further, even if shut-off occurs because it is determined mistakenly due to noise etc. that the value of the flowing current I exceeds the current threshold value Imax, after the constant time, the value of temperature increase to which the additional value is added returns to its original value, so that the limited number of times that the retry operation can be performed also returns to its original value. This eliminates the necessity of a dedicated counter (clear counter) for counting a period in which no overcurrent is detected (see FIG. 6). Further, if the wire temperature Tw decreases below the lower limit temperature Tmin owing to heat dissipation of the wire W after the first forced turn-off operation is performed, the first forced off-state is removed, thereby eliminating the necessity of a dedicated counter for counting the time since the performing of the first forced turn-off operation.

Other Embodiments

The present invention is not limited to the embodiment described with reference to the above explanation and drawings but covers the following various embodiments in its technological scope. In particular, components other than the highest-level ones of the present invention among those of the embodiments are additional and, therefore, can be omitted as appropriate.

(1) Although the above embodiment protects the wire W, the "power supply path" so-called in the present invention is not limited to it. For example, any other conductor such as a pattern on a printed-circuit board may be substituted.

(2) Although the above embodiment has employed the configuration in which the microcomputer 10 is caused to perform the protection processing (processing to calculate the wire temperature etc.), the present invention is not limited to it. A dedicated circuit (ASIC etc.) may be caused to perform part or all of the processing to calculate the wire temperature, the processing for the wire protection function, and the switch protection processing.

(3) Although the above embodiment has employed the sense MOS system for detecting a current by utilizing the sense MOSFET 38, the present invention is not limited to it. For example, the shunt system may be employed for detecting the current by utilizing a shunt resistor connected to the wire W.

(4) Although in the above embodiment, the additional value F has been a temperature obtained by dividing the difference between the upper limit temperature Tmax and the reference temperature To by the number of times X of performing the retry operation, the present invention is not limited to it. For example, the additional value may be a fixed value. In such a case, if the wire W is likely to smoke because the reference temperature To is high, the number of times of performing the retry operation can be reduced to perform the first forced turn-off operation at an early time. If the wire W is hard to smoke because the reference temperature To is low, the number of times of performing the retry operation can be increased to continue power supply control operation as long as possible.

(5) Although in the above embodiment, the semiconductor element 35 is connected to the side higher in potential than the load L, the present invention is not limited to it; it may be connected to the side lower than the load L in potential.

(6) Although the above embodiment shuts off the power supply to the load L by performing the first and the second forced turn-off operations, the present invention is not limited to it. Rather than shut-off, for example, an allowable capacity of the flowing current I may be reduced. In short, it is only necessary to restrict the power supply through the semiconductor switch element.

(7) Although the above embodiment has calculated the wire temperature Tw from the flowing current I, the present invention is not limited to it. For example, a temperature sensor for measuring the wire W may be provided to detect the wire temperature based on a measurement signal from the temperature sensor each time the sampling time interval elapses. In this case also, each time the second forced turn-off operation is performed, the additional value F can be added to the wire temperature, thereby obtaining almost the same effects as those of the above embodiment.

The invention claimed is:

1. A power supply controller comprising:
a switch element connected to a power supply path between a power source and a load;
a current detection element configured to output a detection signal corresponding to a value of a flowing current flowing through the power supply path;
a power-supply-path protection unit configured to perform a power-supply-path protection operation which restricts power supply by use of the switch element on condition that a value of temperature increase of the power supply path with respect to a reference temperature exceeds a temperature threshold value; and
a switch protection unit configured to perform a switch protection operation which restricts the power supply by use of the switch element on condition that a value of the flowing current based on the detection signal exceeds a current threshold value and removes the restriction of the power supply by use of the switch element based on the value of the flowing current after a reference time, wherein
the power-supply-path protection unit (i) has a first operation state in which it adds an additional value to the value of temperature increase and compares a post-addition temperature to the temperature threshold value, if the value of the flowing current exceeds the current threshold value, and (ii) has a second operation state in which it compares the value of the temperature increase to the temperature threshold value without adding the additional value, if the value of the flowing current does not exceed the current threshold value.

2. The power supply controller according to claim 1, wherein the power-supply-path protection unit calculates the value of temperature increase based on a value of the flowing current and thermal characteristics of the power supply path.

3. The power supply controller according to claim 1, wherein the additional value is a fixed value.

4. The power supply controller according to claim 1, wherein the power-supply-path protection unit changes the additional value in accordance with a value obtained by dividing a difference between the reference temperature and the temperature threshold value by a defined value.

* * * * *